United States Patent [19]

Shiokawa et al.

[11] Patent Number: 4,752,685
[45] Date of Patent: Jun. 21, 1988

[54] ELECTRONIC SPECTROMETER FOR IDENTIFYING ELEMENT CONDITIONS OF A SAMPLE SURFACE BY UTILIZING AN ENERGY SPECTRUM OF CHARGED PARTICLES

[75] Inventors: Yoshiro Shiokawa; Kiyoshi Hoshino, both of Fuchu, Japan

[73] Assignee: Anelva Corporation, Tokyo, Japan

[21] Appl. No.: 871,739

[22] Filed: Jun. 9, 1986

[30] Foreign Application Priority Data

Jun. 7, 1985 [JP] Japan .................................. 60-123742
Dec. 16, 1985 [JP] Japan .................................. 60-282518
Feb. 1, 1986 [JP] Japan .................................. 61-20496

[51] Int. Cl.$^4$ ............................................. H01J 49/48
[52] U.S. Cl. .................................... 250/305; 250/306; 378/82
[58] Field of Search .................. 250/305, 310, 306; 378/82, 85, 84

[56] References Cited

U.S. PATENT DOCUMENTS 3,242,335  3/1966  Watanabe et al. .................... 378/85
4,562,352  12/1985  Shiokawa ........................... 250/305

OTHER PUBLICATIONS

Fellner-Feldegg et al., Journal of Electron Spectroscopy and Related Phenomena, 5(1974), 643-689.

Primary Examiner—Craig E. Church
Assistant Examiner—Jack I. Berman
Attorney, Agent, or Firm—Pollock, Vande Sande & Priddy

[57] ABSTRACT

A photoelectron spectrometer includes a target, an electron gun, a crystal plate, a spectrum-analyzer and a detector. The target and the sample to be inspected are aligned with a reference line. The electron gun is positioned on the coaxially line with respect to the reference axis. The crystal plate is arranged in a circular region with respect to the reference axis, so that X-ray beams emitted from the target are omnidirectionally irradiated to the sample surface in an electron shower form. The sensitivity of the photoelectron spectrometer is increased.

6 Claims, 11 Drawing Sheets

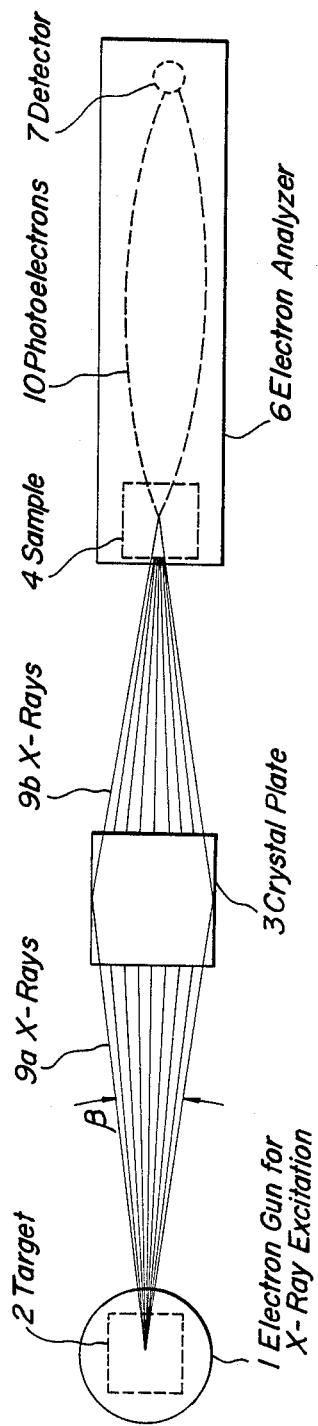
*FIG. IB*
*PRIOR ART*

FIG_3

FIG_4

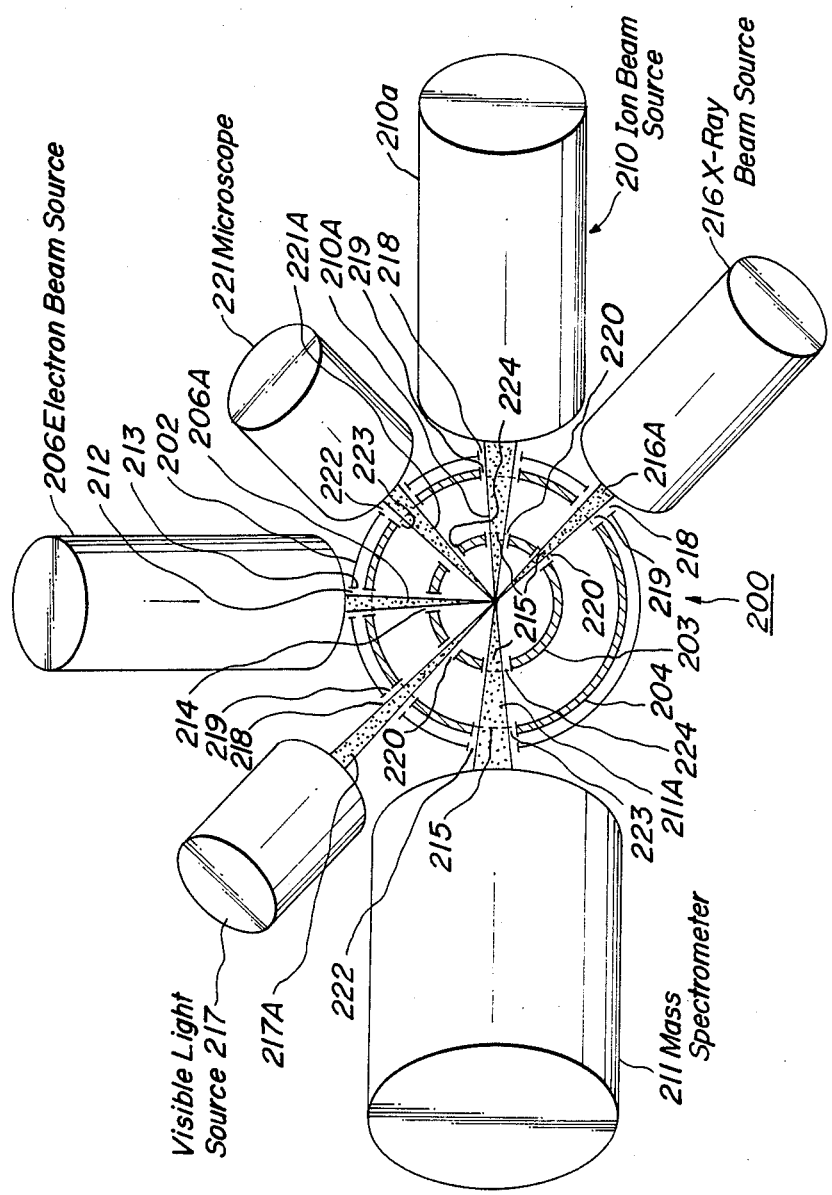

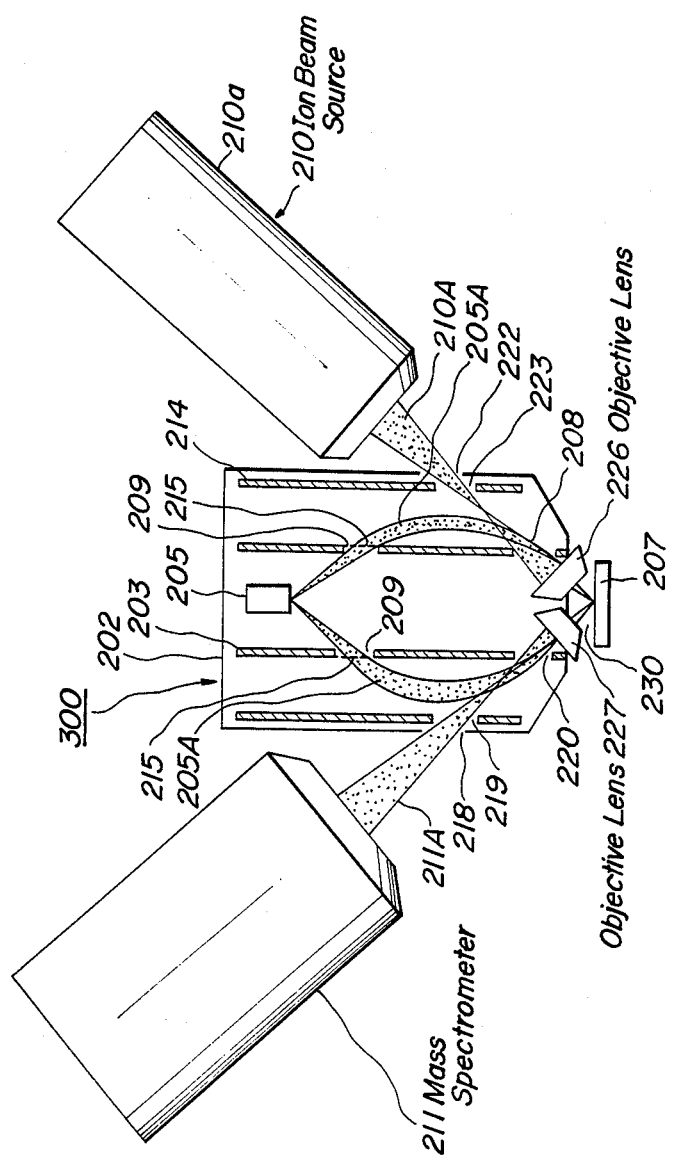

FIG_8A
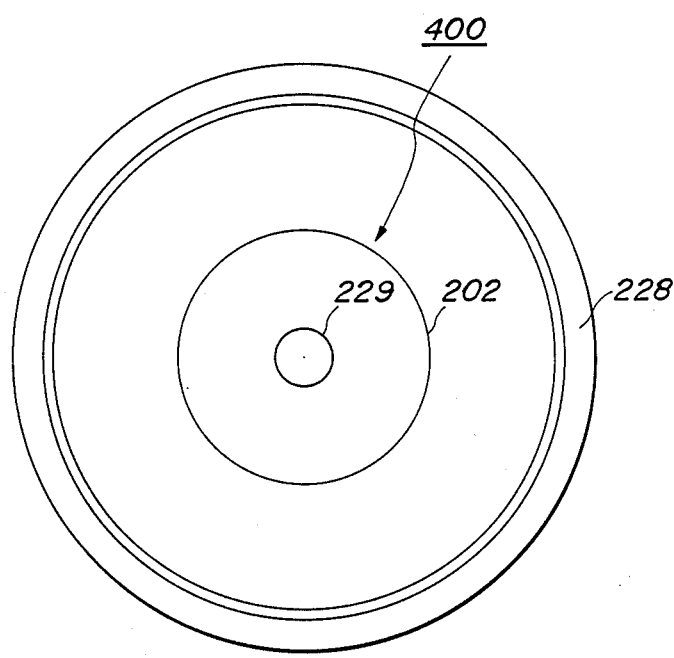

FIG_8B
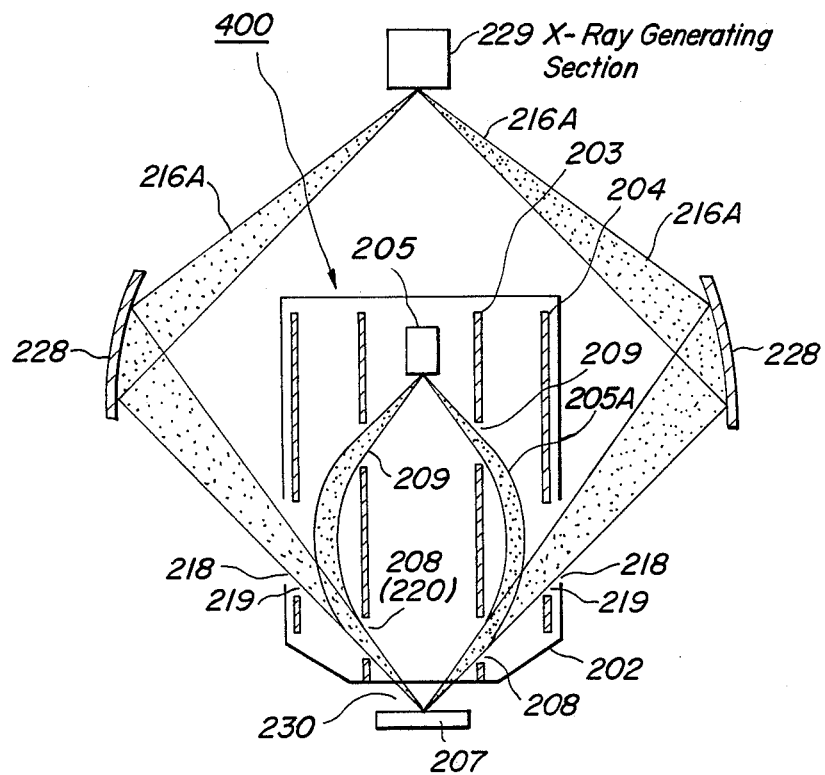

ELECTRONIC SPECTROMETER FOR IDENTIFYING ELEMENT CONDITIONS OF A SAMPLE SURFACE BY UTILIZING AN ENERGY SPECTRUM OF CHARGED PARTICLES

BACKGROUND OF THE INVENTION

1. Field of the Invention

The present invention generally relates to an electronic spectrometer for identifying element conditions of a sample surface by utilizing an energy spectrum of charged particles, e.g., an Auger electron spectrum and a photoelectron spectrum, and more particularly to a photoelectron spectrometer in which photoelectrons emitted from the sample surface by irradiating X-rays having a specific wavelength are energy-analyzed by a detector to identify the element conditions of the sample surface.

2. Description of the Prior Art

A photoelectron spectrometer as described in the preamble is well known in the field. In FIG. 1A, there is shown a cross-sectional view of a conventional photoelectron spectrometer; in FIG. 1B, a plan view thereof. Referring to FIGS. 1A and 1B, an electron gun 1 for exciting X-rays, a target 2, a crystal plate 3, a sample 4, a neutralizing electron gun 5, an electron analyzer 6 and a detector 7 are positioned substantially in a coplanarly. The electron gun 1 emits an electron beam 8 and irradiates it to the target 2.

When irradiated by the electron beam 8, the target 2 emits X-rays 9a omnidirectionally. The functions of the crystal plate 3 positioned substantially midway between the target 2 and the sample 4 are: firstly to collect the X-rays 9a emitted from the target 2; and secondly to separate only X-rays 9b having a specific wavelength; and finally, to irradiate these X-rays 9b to the sample 4 by reflecting them. Upon receipt of the X-rays having the specific wavelength from the crystal plate 3, photoelectrons 10 are omnidirectionally emitted from the sample 4. Only the photoelectrons 10 which are traveling toward a specific region of dimension are conducted to an inlet of the electron analyzer 6. The electron analyzer 6 energy-analyzes the thus conducted photoelectrons 10 and thereafter supplies the energy-analyzed photoelectrons 10 to the detector 7.

The detector 7 identifies the elements contained in the sample 4 by detecting the photoelectrons supplied from the electron anaylzer 6. The neutralizing electron gun 5 irradiates electron beams 11 toward the sample 4 in a shower form so as to neutralize the surface of the sample 4 which is charged to a positive condition in accordance with the emission of the photoelectrons 10.

In the above-described conventional analyzer, since the components are arranged in a coplanarly, the X-ray irradiation and the detection of the photoelectrons 10 are implemented in a coplane. That is to say, as the crystal plate 3 is positioned at one side, viewed from the target 2, the X-rays 9a omnidirectionally emitted from the target 2 are partially utilized for the photoelectron analysis. The partial X-rays 9a pass through a specific region which is defined by an angle of "$\alpha$" radians (referred to as "detectable opening angle $\alpha$") in a horizontal plane and by an angle of "$\beta$" radians (referred to as "detectable circle angle $\beta$") in a vertical plane. Normally, this region covering the detectable opening angle $\alpha$ nearly equals to the detectable circle angle (0.1 to 0.3). Similarly, only the photoelectrons 10 omnidirectionally emitted from the sample 4 are partially conducted into the electron analyzer 6, because the hemispherical electron analyzer 6 has the inlet directing to a given direction, as shown in FIG. 1A.

Accordingly, the sensitivity of the photoelectron detection is very low, resulting in an extremely long time for analyzing the element conditions of the sample surface. Moreover, due to a lack of sensitivity, it is practically impossible to analyze a very small content, or a very small part of a sample.

Althrough not shown in detail in the drawings in FIGS. 1A and 1B, the through holes, through which the electron beams pass, may cause disturbances of the electric field as well as the magnetic field, so that precise photoelectron analysis can be disturbed.

To solve the above-described conventional drawbacks, an object of the present invention is to provide an electronic spectrometer by which the X-rays as well as the charged particles that are omnidirectionally emitted from the target and the sample respectively are more efficiently utilized to analyze the sample at the highest sensitivity.

Another object of the invention is to provide a photoelectron spectrometer in which the photoelectron spectroscopy can be implemented at a narrow region while maintaining the practical sensitivity.

A further object of the invention is to provide an electronic surface analyzer in which the sample analysis can be performed by utilizing the spectrum analysis without receiving adverse influences from leakage electric field and also leakage magnetic fields. This electronic surface analyzer can analyze a sample having a concave and convex surface with practically acceptable sensitivity.

SUMMARY OF THE INVENTION

These objects and the features of the present invention can be accomplished by providing a photoelectron spectrometer comprising:

a target;

an electron gun for irradiating electron beams to the target so as to emit X-ray beams from the target;

a crystal plate for focusing the X-ray beams emitted from the target and for reflecting the focused X-ray beams to be irradiated to a sample;

an analyzer for spectrum-analyzing photoelectrons emitted from the sample; and a detector for detecting the spectrum-analyzed photoelectrons characterized in that:

said electron gun is arranged on the substantially coaxial line with respect to a reference axis connecting said target and said sample, and said crystal plate is arranged in a circular region with respect to said reference axis.

Further, the present invention can be accomplished by providing a photoelectron spectrometer comprising:

an X-ray source; and an electron analyzer, characterized in that:

said X-ray source is constructed of a target and a focusing type spectro-crystal plate, said target being irradiated by electron beams emitted from an ultrasmall focusing type electron gun so as to emit X-rays and said X-rays being focused onto a surface of a sample by employing said focusing type spectro-crystal plate, and said electron analyzer is a single-pass cylindrical mirror type analyzer.

Moreover, the present invention can be accomplished by providing a surface spectrometer comprising:

a cylindrical mirror type energy analyzer including an inner cylindrical electrode, an outer cylindrical electrode surrounding the inner cylindrical electrode, and an electron detector positioned within the inner cylindrical electrode, for detecting electrons emitted from a sample located under the inner cylindrical electrode; and at least one of irradiating beam supply means and beam detecting means which are arranged outside the mirror type energy analyzer, said irradiating beam means supplying irradiating beams to said sample, and emission beam detecting means detecting emission beam from said sample, characterized in that:

beam passing holes are formed on said inner cylindrical electrode and said outer cylidrical electrode so as to pass therethrough at least one of said irradiation beams and said emission beams.

BRIEF DESCRIPTION OF THE DRAWINGS

For a better understanding of these and other objects of the present invention, reference is made to the following detailed description of the invention to be read in conjunction with the following drawings, in which:

FIG. 1B is a plan view of the spectrometer shown in FIG. 1A;

FIGS. 6A and 6B show schematic diagrams of a cylindrical mirror type energy analyzer according to a fourth embodiment belonging to the third category of the invention;

FIG. 7 shows a schematic diagram of a cylindrical mirror type energy analyzer according to a fifth embodiment belonging to the third category of the invention; and FIGS. 8A and 8B show schematic diagrams of a cylindrical mirror type energy analyzer according to a sixth embodiment belonging to the third category of the invention

DETAILED DESCRIPTION OF THE PREFERRED EMBODIMENTS

The above-described objects and other useful and novel features of the present invention will become more readily apparent from the following descriptions according to the invention.

BASIC IDEA OF FIRST CATEGORY

Before describing various types of preferred embodiments according to the invention, a basic idea belonging to the first category of the invention will now be summarized.

The electron beam is emitted from the electron gun for X-ray excitation, and irradiated along the reference axis toward the target. From the target, the X-rays are omnidirectionally emitted. The emitted X-rays are collected by the crystal plate which is arranged on the circle with respect to the reference axis at a center. The X-rays are separated and reflected by this crystal plate, with the result that the X-rays having a specific wavelength are omnidirectionally irradiated toward the sample with respect to the reference axis. While the photoelectrons are emitted from the sample in response to the X-ray irradiation, these photoelectrons are spectrum-analyzed under the influence of the trail controlling. Then, the spectrum-analyzed photoelectrons are conducted into the detector. The detector detects these photoelectrons to identify the elements contained in the photoelectrons, i.e., the sample.

In accordance with the basic idea of the first category, since the crystal plate is positioned in the circle region with respect to the reference axis as its center, most of the X-rays which are emitted from the target with the axial-symmetrical relation can be collected by the crystal plate. Moreover, most of the X-rays having the specific wavelength which are reflected from the crystal plate can be irradiated to the sample.

As a result, substantially all of the X-rays emitted from the target can be utilized at a higher efficiency, so that large quantities of the photoelectrons emitted from the sample can be utilized to analyze the elements with the higher sensitivity by the detector.

ARRANGEMENT OF FIRST EMBODIMENT BELONGING TO FIRST CATEGORY

A description will now be made of a single pass cylindrical mirror type electron analyzer according to a first embodiment belonging to the above-described first category with reference to FIGS. 2 and 3.

Figure 1A:
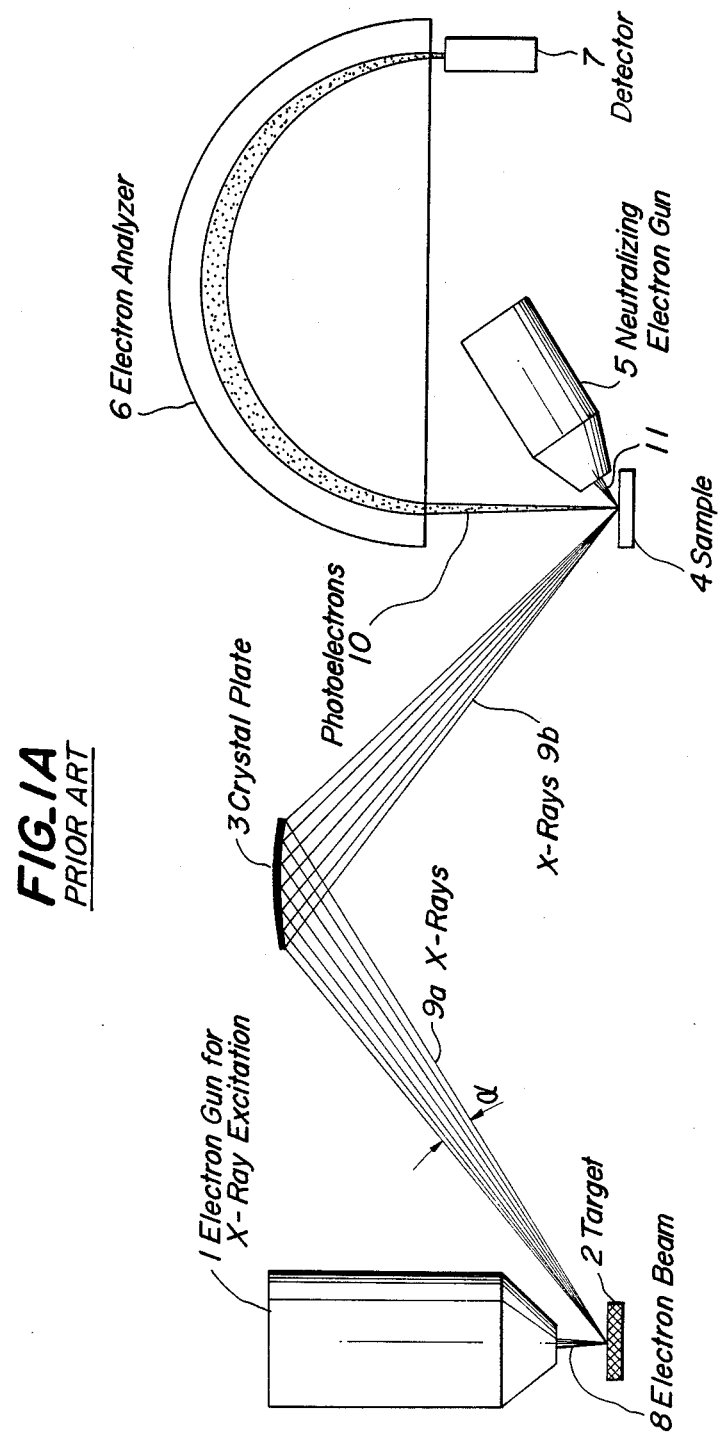
FIG. 1A is a cross sectional view of the conventional electronic spectrometer.

It should be noted that the same reference numerals shown in FIGS. 1A and 1B will be employed as those for denoting the same circuit elements shown in the following figures.

Figure 2:
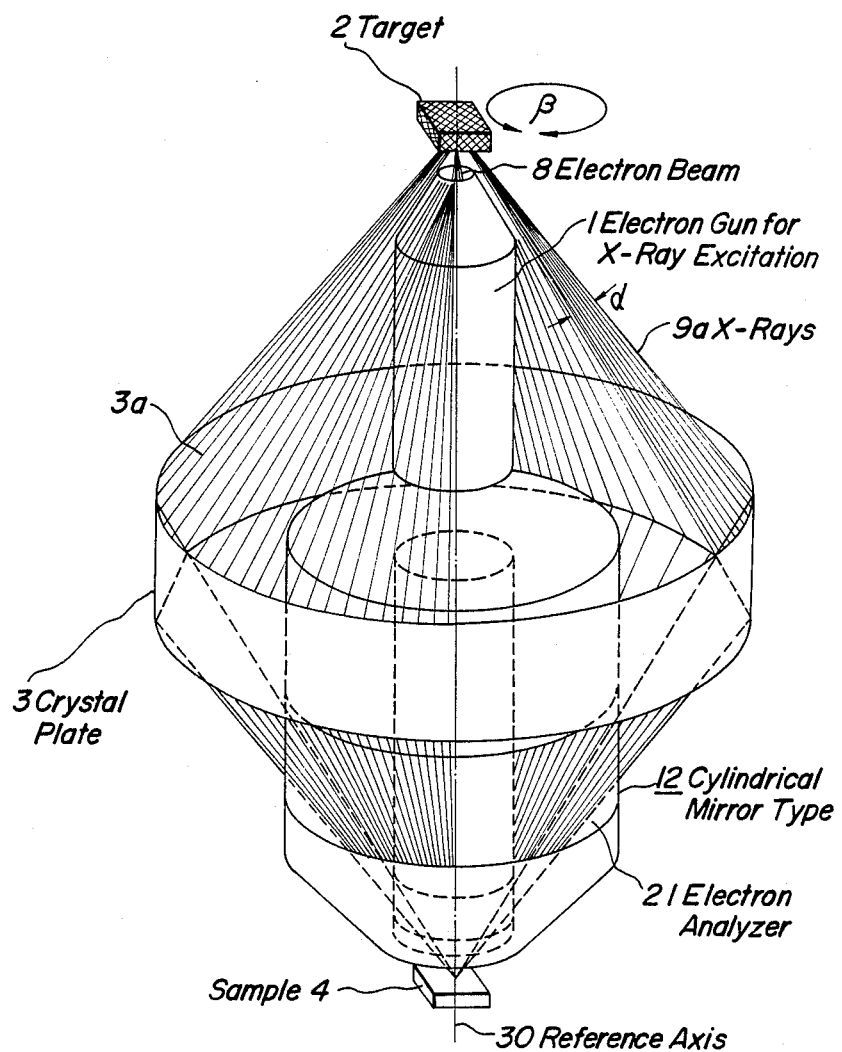
FIGS. 2 and 3 show schematic diagrams of a single pass cylindrical mirror type electron analyzer according to a first embodiment belonging to the first category of the invention.
Figure 3:
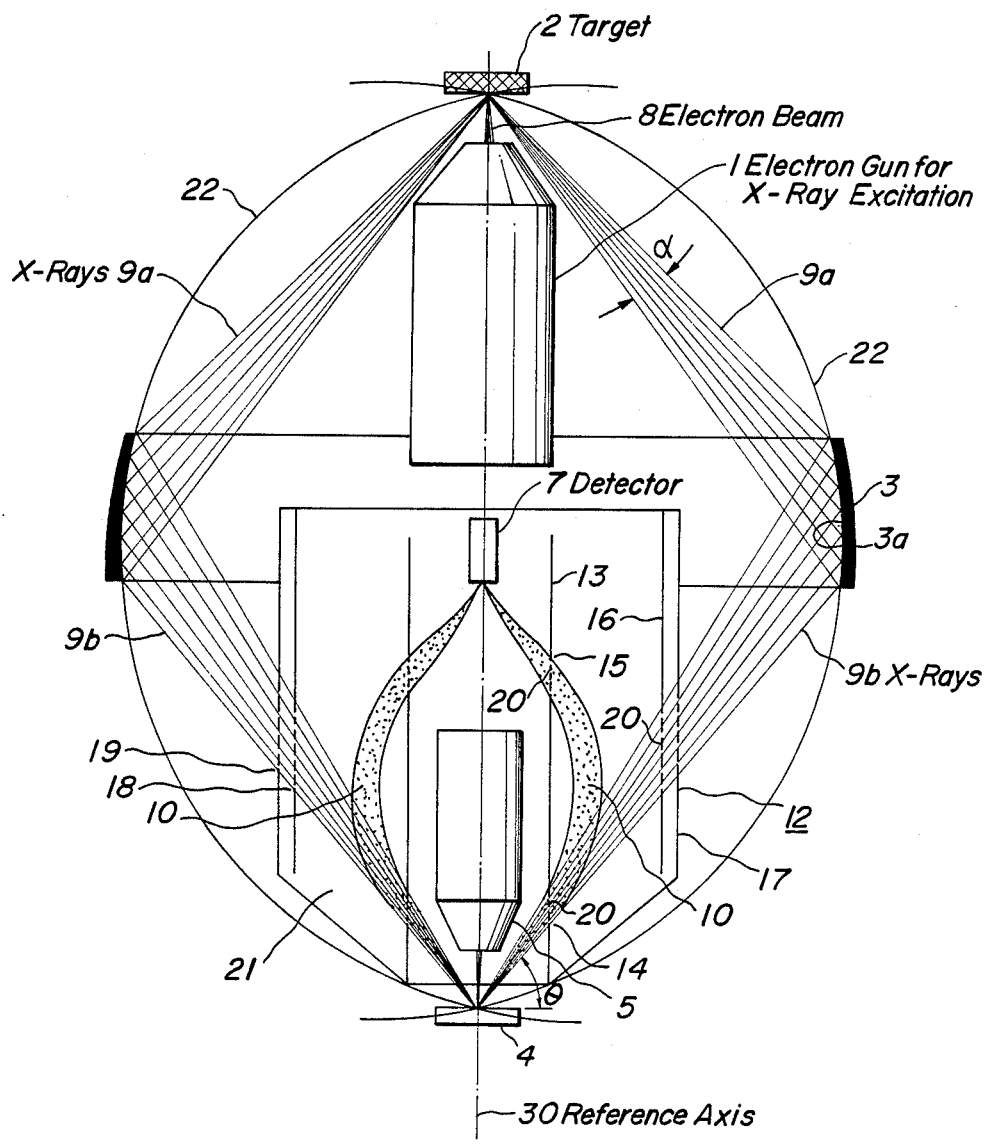

As shown in FIGS. 2 and 3, the target 2 is positioned opposite to the sample 4 with a predetermined interval, and a line connecting between a center of the target 2 and that of the sample 4 is defined as the reference axis 30 in this specification.

The characteristic arrangement of this first embodiment is that the electron gun for X-ray excitation 1, the crystal plate 3, the neutralizing electron gun 5, the single pass cylindrical type electron analyzer 12 and the detector 7 are three-dimensionally arranged, and furthermore arranged in a coaxial relation to the reference axis 30. In addition, the crystal plate 3 has a specific form, i.e., an axial-symmetrical shape with respect to the reference axis 30 (in this embodiment, the shape of this crystal plate 3 is a ring). In the upper portion of the drawing, there is provided the electron gun 1 for X-rays, the beam irradiation surface of which is directed toward the target 2, whereas the neutralizing electron gun 5 is provided in the drawing, the beam irradiation surface of which is directed toward the sample 4. That is to say, the beam irradiation surface of the X-ray electron gun 1 is directed toward the upper portion of the drawing, whereas that of the neutralizing electron gun 5 is directed toward the lower portion thereof.

Between the X-ray electron gun 1 and the neutralizing electron gun 5, the detector 7 is provided, the conducting plane for the electron beam 8 of which is directed toward the lower portion of the drawing, i.e., the sample 4 (see FIG. 3). The crystal plate 3 is shaped in a ring, as shown in FIG. 2, the center axis of which is coincident with the reference axis 30. The curved surface of the reflection plane 3a of the crystal plate 3 is also coincident with the circular curved plane which is formed by gathering Rowland circles 22 along the circle of the crystal plate 3.

According to the present embodiment, the electron analyzer 12 is constructed of a cylindrical mirror type electron analyzer, the inner cylinder 13 of which encompasses both the neutralizing electron gun 5 and the detector 7.

A first photoelectron passing hole 14 is formed around the lower portion of the inner cylinder 13 and a second photoelectron passing hole 15 is formed around the upper portion of the inner cylinder 13. Both the first and second photoelectron passing holes 14 and 15 have two functions for passing not only the photoelectrons but also the X-rays 9b. First and second X-ray irradiating holes 18 and 19 are formed on predetermined positions of the housing case 17 and the outer cylinder 16 of the cylindrical mirror type electron analyzer 12.

Since the outer cylinder 16 is biased to negative potential and the inner cylinder 13 is grounded, an electric field is formed between the inner cylinder 13 and the outer cylinder 16 for performing the photoelectron analysis. To prevent the electric field from being disturbed, a metal mesh 20 having narrower meshes and higher trasmission is provided on the first and second photoelectron passing holes 14 and 15, and the first X-ray irradiating hole 18 if desired.

OPERATIONS OF CYLINDRICAL MIRROR TYPE ELECTRON ANALYZER

A description will now be made of operations of the cylindrical mirror type electron analyzer 12 belonging to the first category with reference to FIGS. 2 and 3.

The electron beam 8 is irradiated from the electron gun 1 for exciting X-rays along the reference axis 30 and then projected to the target 2. By projecting the electron beam 8, the X-rays 9a are omnidirectionally emitted from the target 2. Thus emitted X-rays 9a are influenced by the beam-condensing effect and beam-splitting effect, so that the emitted X-rays 9a having an umbrella shape of a detectable opening angle "α" over the entire circle can be condensed by the crystal plate 3, and the X-rays 9b having a specific wavelength are selected from the condensed X-rays 9a to be reflected toward the sample 4. The reflected X-rays 9b pass through the second X-ray irradiating hole 19, the first X-ray irradiating hole 18 and the first photoelectron passing hole 14 in this order and are irradiated to the sample 4 at the deep angle "θ". Then the photoelectrons 10 are omnidirectionally emitted from the sample 4. Thus, the emitted photoelectrons 10 pass through the same path as the reflected X-rays in the opposite direction, i.e., from the inner cylinder 13 via the photoelectron passing hole 14 into the space region 21 formed between the inner cylinder 13 and the outer cylinder 16. In this space region 21, these photoelectrons 10 are energy-analyzed under the influence of the orbit controlled by the electric field. Thereafter, the energy-analyzed photoelectrons 10 are reentered from the second photoelectron passing hole 15 into the inner cylinder 13 and finally collected by the detector 7.

The detector 7 identifies the elements of the sample by detecting the collected photoelectrons 10.

In accordance with the first embodiment, all of the X-rays which are present within a given region having a specific angle with respect to the reference axis 30 can be utilized for the photoelectron analysis. That is to say, these X-rays 9a are located in the umbrella-shaped region that is defined by the detectable opening angle "α" and the detectable circle angle "β" ($\beta = 2\pi$ radians) around the reference axis 30. Similarly, all of the given photoelectrons are selected from the photoelectrons 10 emitted from the sample 4 based upon a given angle with respect to the reference axis 30. In other words, all of the photoelectrons present in a region defined by the given angle with respect to the reference axis 30 over the cylindrical shape can be utilized for the photoelectron analysis.

As a result, the efficiency of utilizing the emitted X-rays 9a and the emitted photoelectrons 10 can be highly improved, as compared with the conventional photoelectron analyzer. Since the total detection sensitivity of the detector 7 can be increased, it is possible to precisely perform the element identification contained in a very small region of the sample 4, or the identification for a very little element contained therein.

EFFECTIVE UTILIZING OF X-RAYS

Precisely speaking, the efficiency for utilizing the emitted X-rays is optimum, or becomes the practical limit value according to the arrangement of the invention. The following two main reasons can be conceived.

First, it is obvious that the electron beam 8 irradiated to the target 2 at a substantially right angle with respect to the target surface are not essentially utilized and positioning the X-ray (excitation) electron gun 1 apart from the target 2 causes the performance to be degraded, e.g., an increase of the electron beam's diameter and a decrease of the current density. Also, since the X-rays travelling toward the target surface parallel thereto are energy-absorbed at the target surface, the energy intensities thereof are inherently low. Consequently, the X-rays 9a which are inherently available are present within a predetermined angle range with respect to the reference axis 30. As previously described in the first embodiment, all of the X-rays located within such a predetermined angle range can be effectively utilized over the circular region.

Secondly, no shield can be made for the X-rays 9b irradiated from the circular region, because the cylindrical mirror type electron analyzer 12 which is of a small and axial-symmetrical type, and ring-shaped X-ray irradiating holes are formed in the inner cylinder 13 and the outer cylinder 16, through which X-rays can pass.

The detectable opening angle "α" is practically selected to be 0.1 to 0.3 radians, as in the conventional analyzer, but the detectable circle angle "β" is practically chosen to be $2\pi$ radians according to the first embodiment.

To the contrary, both the detectable opening angle "α" and the detectable circle angle "β" are selected to be equally 0.1 to 0.3 radians. Accordingly, the effective utilization of the X-rays according to the present embodiment amounts to 5 to 20 percent of the total X-ray emission quantity, whereas those of the conventional analyzer amount to at most 0.1 to 1 percent. That is to say, according to the invention, the efficiency for utilizing the emitted X-rays becomes 10 to 100 times higher than that of the conventional analyzer.

Similarly, as to the utilization efficiency of the photoelectron 10, much improvement can be achieved according to the invention because of the above-described first reason. Taking account of both of the utilization efficiencies for the X-rays 9a and photoelectrons 10, the total detection sensitivity becomes at least 100 to 1000 times higher than in the conventional analyzer, resulting in the photoelectron analysis with the extremely high sensitivity.

OTHER ADVANTAGES OF FIRST ANALYZER

There are advantages of the first cylindrical mirror type electron analyzer 12 other than high sensitivity. First, the precise element analysis can be effected for the sample 4 having a concave-and-convex surface since the X-ray 9b can be irradiated to the concave surface. This is because the irradiation direction of the X-rays 9b is completely coincident with the detection direction of the photoelectrons 10 (i.e., a travelling direction of the photoelectrons from the sample 4 to the first X-ray passing hole 14), the irradiation of the X-rays 9b occurs over the cylindrical region, and the irradiation angle thereof "$\theta$" becomes great.

As previously described, all components are arranged in an axial-symmetrical relation to the reference axis 30, a very simple arrangement can be realized, with the result that the assemblying precision can be improved and the low cost analyzer can be also obtained. Moreover, a small-sized analyzer can be achieved. Since the metal mesh 20 may be provided on the first and second photoelectron passing holes 14 and 15, and the first X-ray irradiating hole 18, the disturbance of the electric field in the space 21 can be avoided to achieve the stabilized electron analysis.

Although in the above-described embodiment, there was shown a typical example where the reference axis 30 is not coincident with the diameter axis of the Rowland circle 22, if the reflection angle at the crystal plate 3 is selected to be 90° (e.g., depending upon sorts of the target 2 and the crystal plate 3), the reference axis 30 is perfectly coincident with the diameter axis of the Rowland circle 22, resulting in a perfect spherical reflecting plane 3a (i.e., the curved surface) of the crystal plate 3.

When the reflecting plane 3a of the crystal plate 3 is formed as a spherical plane, the crystal plate 3 can be easily manufactured, so that the precision of the mechanically manufacturing of the crystal plate 3 can be more improved than in the curves surface. Accordingly, the advantages of the embodiment are conspicuous.

ARRANGEMENT AND OPERATION OF SECOND EMBODIMENT BELONGING TO FIRST CATEGORY

A description will now be made of a cylindrical mirror type electron analyzer 32 according to the invention, belonging to the first category.

Figure 4:
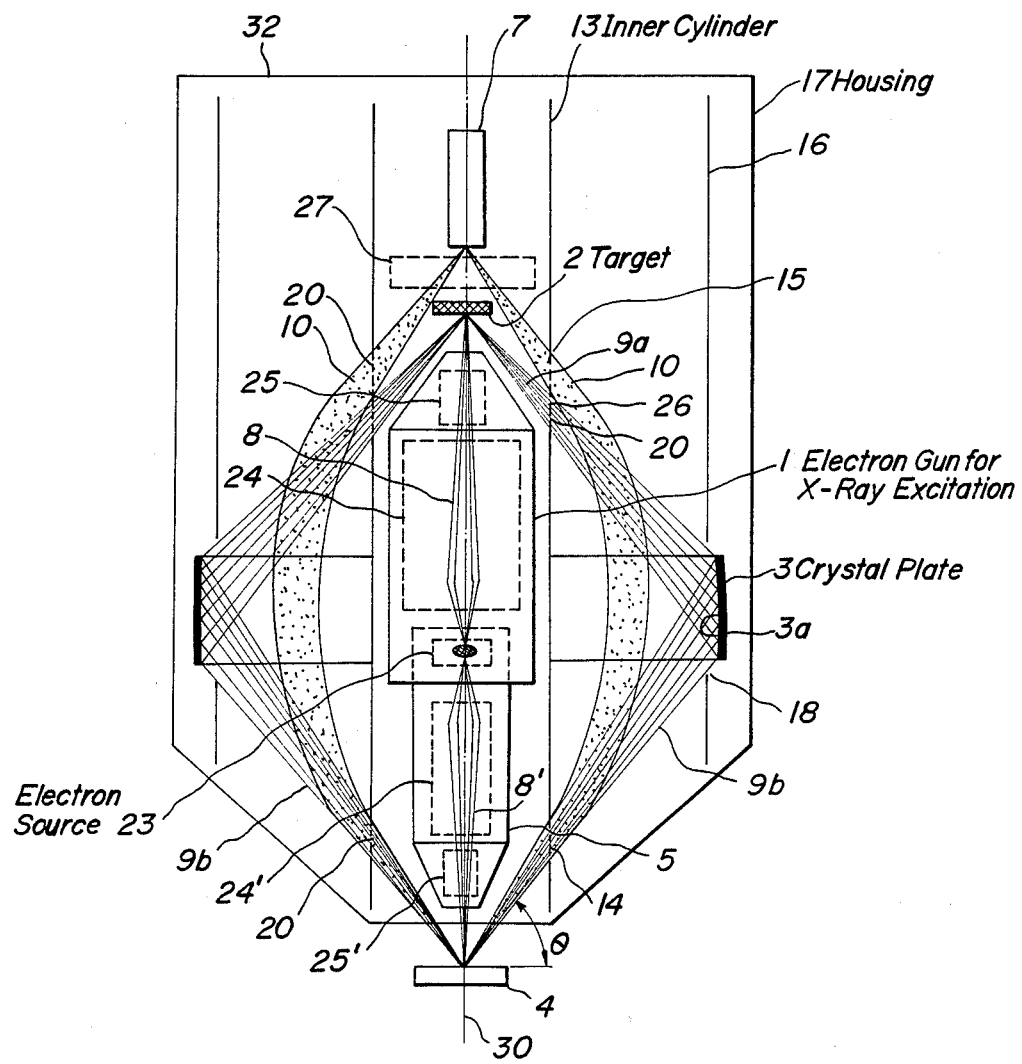
FIG. 4 shows a schematic diagram of a single pass cylindrical mirror type electron analyzer according to a second embodiment belonging to the first category of the invention.

It should be noted that the same reference numerals shown in FIGS. 2 and 3 will be employed as those for denoting the same components shown in FIG. 4.

Briefly speaking, the different arrangements from the first embodiment are that both the X-ray excitation electron gun 1 and the target 2 are provided within the inner cylinder 13 of the cylindrical mirror type electron analyzer 32, and the crystal plate 3 is stored in the housing 17, resulting in a small-sized photoelectron analyzer.

Referring now to FIG. 4, there is shown the X-ray excitation electron gun 1 which is integrally connected to the neutralizing electron gun 5, which are mounted on a supporting arm (not shown in detail) connected to the inner wall of the inner cylinder 13. A common electron source 23 is provided in such connected members, i.e., the X-ray excitation electron gun 1 and the neutralizing electron gun 5, for generating the X-ray excitation electron beam and the neutralizing electron beams therein. One of the electron beam 8 generated from the electron source 23 is irradiated to the target 2 in the inner cylinder 13 through a beam converting section 24 and a deflection section 25, while the other of the electron beam 8 is similarly irradiated to the sample 4 though another converting section 24' and another deflection section 25'.

These beam converting sections 24 and 24', and deflection sections 25 and 25' are constructed of electrodes respectively. The X-ray irradiating holes 26 are formed over the entire circle of the inner cylinder 13, so that the X-rays 9a emitted from the target 2 can be substantially completely conducted through the X-ray irradiating holes 26 into the crystal plate 3.

The crystal plate 3 is fixed on the outer cylinder 16 of cylindrical mirror type electron analyzer 32. As previously described, since the outer cylinder 16 is biased to the negative potential, the potential of the crystal plate 3 is different from that of the first embodiment as shown in FIGS. 2 and 3. However, no influence is given to the X-rays due to this potential difference because the X-rays are not charged. In the second embodiment, a photoelectron delfection section 27 constituted of an electrode is positioned in front of the detector 7 (i.e., at the photo-electron conducting side), so that the pass orbit of the photoelectrons 10 can be controlled by opening the photoelectron deflection section 27. As a result, these photoelectrons 10 can be correctly conducted into the beam inlet of the detector 7. It should be noted that since the electrode of the photoelectron deflection section 27 has the same polarity as the electrode of the deflection section 25 of the X-ray excitation electron gun 1, but the different polarity from the deflection section 25' of the neutralizing electron gun 5, the relative connection between the photoelectron deflection section 27 and the respective deflection sections 25 and 25' can be realized.

It is apparent from the foregoing descriptions that since the components of the second embodiment are three-dimensionally arranged and also axial-symmetrically positioned in relation to the reference axis 30 as in the previous embodiment, the same various advantages are obtained and furthermore, the following specific advantages can be additionally achieved.

As shown in FIG. 4, not only the neutralizing electron gun 5 as well as the detector 7, but also the X-ray excitation electron gun 1 are mounted on the inner cylinder 13, and the crystal plate 3 is fixed on the outer cylinder 16. Accordingly, the X-ray excitation electron gun 1 and the plate crystal 3 are mounted on the cylindrical wall of the cylindrical mirror type electron analyzer 32, which has been previously aligned with the reference axis 30, so that an easy alignment for the X-ray excitation gun 1 and also the crystal plate 3 can be achieved when they are assembled. As no highly precise mounting is required, remarkably lower cost and also improved precision of assembling and measuring can be realized.

Because both distances between the crystal plate 3 and the target 2, and between the crystal plate 3 and the sample 4 are short, the efficiency for utilizing the X-rays can be increased, as compared with that of the same sided crystal plate with the normal distance. As a result, the detection sensitivity for the photoelectrons 10 can be further improved.

In the second preferred embodiment, the common electron source 23 is employed for both the X-ray excitation electron gun 1 and the neutralizing electron gun 5. Only one set of such an electron source 23, which is generally very complex and expensive and needs its own control power supply (not shown), is sufficient to excite the X-rays and to neutralize the sample 4 by the electron shower. Consequently, the cost of this photoelectron analyzer 32 can be considerably reduced. Furthermore, as the photoelectron deflection section 27 is positioned in front of the detector 7, operations of the photoelectron deflection section 27 and the other deflection sections 25, 25' are related to each other by means of the relative connection.

Controlling the voltages applied to the electrodes of the photoelectron deflection section 27, deflection sections 25 and 25' enables the irradiating position of the electron beam 8 on the target 2, i.e., the emitting position of the X-rays 9a to be freely changed, In addition, the X-ray irradiating position on the sample 4, i.e., the analyzing position thereof can be varied in accordance with the X-ray emitting position.

According to the second embodiment, it is possible to analyze the arbitrary position on the sample 4. The corrected photoelectron analysis can be therefore achieved by automatically shifting the irradiating point of the electron shower in response to the deviation of this analyzing position and also by automatically controlling the focal point of the spectro-analyzed photoelectrons to the detecting position of the detector 7.

While the invention has been described using specific embodiments it should be understood that further modifications can be made without departing from the scope of the first category according to the invention.

For instance, although the crystal plate 3 was fixed on the outer cylinder 16 in the above second preferred embodiment, it is possible to store the crystal plate 3 into the inner cylinder 13, resulting in a smaller analyzer. The continuous ring-shaped crystal plate 3 may be modified by e.g., arranging a plurality of small and discontinuous crystal plates in a circular region with respect to the reference axis 30. The X-rays 9b to be irradiated to the sample 4 need not pass through the photoelectron passing hole 14 of the cylindrical mirror type electron analyzer 12, or 32, but may pass through notches. Also the X-rays 9b may pass through a space defined by the sample 4 and the lower portion of the cylindrical mirror type electron analyzer 12 or 32 to irradiate the sample 4.

It is possible to employ as the cylindrical mirror type electron analyzer 12 or 32 the single-pass type as mentioned above, but also the double-pass type and other electron-pass types. If the performance of the neutralizing electron gun 5 is improved (i.e., the Auger electrons being excited from the sample 4 by setting the gun energy high), then this neutralizing electron gun 5 can have the function as an electron beam source for Auger electron anaylzer. If the beam diameter of the neutralizing electron gun 5 is narrowed to observe the surface of the sample 4, this neutralizing electron gun 5 can also have the function as a scanning type electron microscope.

That is to say, it is possible to construct the Auger electron analyzer from the neutralizing electron gun 5 and the cylindrical mirror type electron analyzer 12 or 32, to otherwise provide the function of the scanning type electron microscope, in addition to the cylindrical mirror type utilizing the neutralizing electron gun 5.

BASIC IDEA OF SECOND CATEGORY

A basic idea according to the second category of the invention will now be summarized.

In a photoelectron analyzer including an X-ray source and an electron analyzer, a target is used as this X-ray source, to which electron beams emitted from an ultra-small focusing type electron gun are irradiated. X-rays produced from the target are converged onto a sample surface by employing a focusing type spectro crystal plate, and a single-pass cylindrical mirror analyzer is utilized as the electron analyzer.

As a result, the photoelectron analysis for a small region less than 1 mm $\phi$ (diameter) can be accomplished with the practical sensitivity. Moreover, the photoelectron analyzer can be provided by which the photoelectron image of lateral element distribution can be obtained.

ARRANGEMENT OF THIRD EMBODIMENT BELONGING TO SECOND CATEGORY

Figure 5:
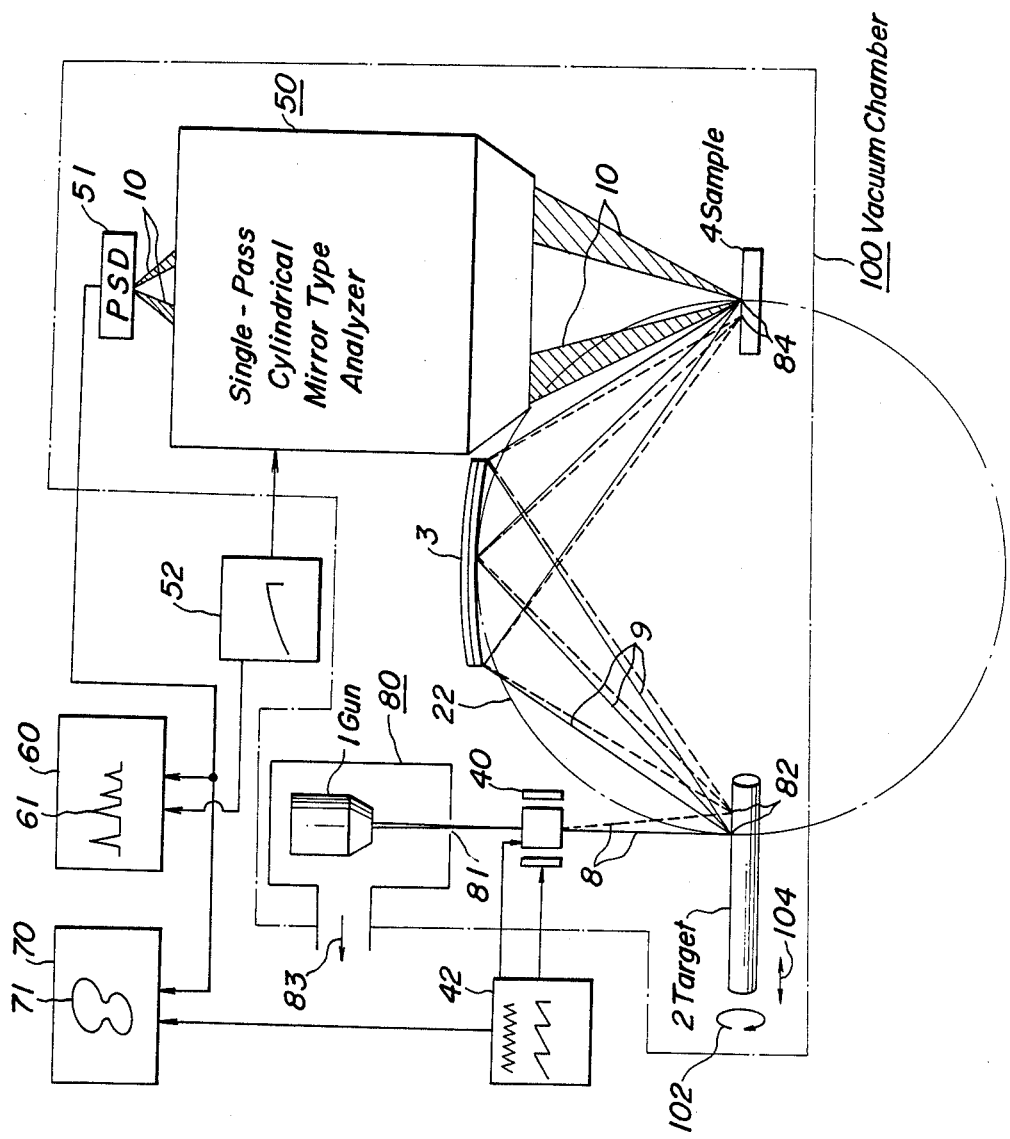
FIG. 5 shows a schematic diagram of photoelectron analyzer according to a third embodiment belonging to the second category of the invention.

Referring now to FIG. 5, an arrangement of the third embodiment belonging to the second category will be described.

It should be noted that the same reference numerals shown in FIGS. 2 through 4 are employed for the same or similar components shown in FIG. 5.

A vacuum chamber 100 is provided which includes the X-ray excitation electron gun 1, the movable target 2, the focusing type crystal plate 3, the sample 4, and a single-pass cylindrical mirror type analyzer 50 and a position analyzing type detector 51. These components are arranged along the electron beam and the X-ray beam pass paths in this order. The electron gun 1 is positioned in a differential pumping chamber 80. The electron beam 8 emitted from the electron gun 1 is deflected by a beam deflecting plate 40. The beam deflecting plate 40 is energized by a beam deflection/scanning power supply 42. A position sensitive type detector 51 is located to receive the photoelectrons from the single-pass cylindrical mirror type analyzer 50. A spectro scanning power supply 52 is coupled to the single-pass cylindrical mirror type analyzer 50. A recorder 60 and a TV monitor 70 are connected to the position sensitive type detector 51. The recorder 60 is energized by the spectro scanning power supply 52, whereas the TV monitor 70 is energized by the beam deflection/-scanning power supply 42.

The electron gun 1 as shown is the ultra-small focusing type electron gun, the beam irradiating region of which is approximately 0.1 mm $\phi$ (diameter). The ultra-small focusing type electron gun 1 has the deflection function for arbitrarily changing the beam irradiating position 82 by the deflecting plate 40. The electron beam 8 impinges on the target 2, so that the X-rays 9 are emitted from a very small region of the target 2, which corresponds to the above-described irradiating region, i.e., an area of approximately 0.1 mm $\phi$. The focusing type spectro crystal plate 3 is so-called as "Johannsson type crystal plate" which spectro-analyzes the incident X-rays 9, i.e., monochromatic analyzing, and also converting the analyzed X-rays (namely, an image of the X-ray source being focused. In this embodiment, since the image forming magnification of the spectro crystal plate 3 is selected to be 1, the X-ray image having a diameter of approximately 0.1 mm can be formed on the image forming plane. That is to say, as the sample surface 4 is positioned on the Rowland circle 22 of the image formation, the X-rays having a diameter of about 0.1 mm which have been narrowed can be irradiated to the irradiating position 84 of the sample 4. The X-ray irradiating position 84 of the sample 4 is moved in response to slight positional deviation of the X-ray generating position, i.e., the beam irradiating position 82 (the dot lines indicate the electron beam and the X-rays when the beam irradiating position is shifted). Accordingly, the application of the deflection voltage to the deflecting plate 40 permits the X-ray irradiating position 84 of the sample 4 to be freely varied.

The electron beam 8 is converged only on a very small irradiation region having a diameter of 0.1 mm of the target 2, resulting in high temperatures and damage of this very small region. It is therefore a solution to mechanically move the target 2 in a two-dimensional direction at a high speed. Then, the average irradiation area per a unit time can be increased. For instance, when the two-dimensional travel distance is selected to be 1 mm×1 mm, the average irradiation area per a unit time becomes 100 times greater than that of the single irradiation area. As a result, occurrence of the damage of the target 2 can be considerably reduced. In other words, the X-ray intensity of the present analyzer can be increased because the average irradiation area of the target 2 per a unit time is enlarged, as compared with the single irradiation region.

FEATURES OF THIRD EMBODIMENT

A very important feature of the invention is such a two-dimensional movement of the target 2 when the electron irradiating region is very narrow, e.g., the ultra-small focusing type electron gun 1. According to the third embodiment, this two-dimensional movement is accomplished by the rotational movement (denoted by an arrow 102) and the reciprocation (indicated by an arrow 104).

As previously described, a single-pass cylindrical mirror analyzer 50 is employed as the electron analyzer. This electron analyzer has various features that the transmission is very high, i.e., higher electron convergence as well as electron detectability, although the analyzer is very compact and a simple construction. This transmission is defined by a ratio of a total quantity of electron energy emitted from the sample surface to a quantity of electron detection. The typical transmission of a hemispherical analyzer is approximately 0.01, whereas that of a single-pass cylindrical mirror analyzer is on the order of 0.1. Then, the transmission of the later analyzer is approximately 10 times higher than that of the former analyzer. The single-pass cylindrical mirror analyzer has however an inherent drawback that the effectively analyzing region on the sample surface is very small, e.g., less than 1 mm $\phi$ (diameter). Furthermore, if there are electrons emitted from outside of this effectively analyzing region, they affect the energy resolution, or resolving power of the single-pass cylindrical mirror analyzer. This is the reason why the single-pass cylindrical mirror analyzer is not a proper conventional electron analyzer. Nevertheless, in accordance with the present invention, this single-pass cylindrical mirror analyzer can be satisfactorily utilized in the photoelectron analyzer as shown in FIG. 5. Since a diameter of the X-ray beam is narrowed, or focused to on the order of 0.1 mm $\phi$ and irradiated to the sample 4, substantially no adverse effect is given to the energy resolution of the single-pass cylindrical mirror analyzer 5, and the sensitivity thereof is approximately 10 times higher than that of the conventional hemispherical analyzer. Moreover, a compact and low-cost electron analyzer can be obtained. In other words, all of the inherent advantages of the single-pass cylindrical mirror analyzer 50 can be utilized while the inherent drawbacks thereof are suppressed.

The major function of the position sensitive type detector 51 is to detect where the photoelectrons 10 can reach on the surface of the detector 51, so that the energy resolution can be varied, or the more than two photoelectrons having different energy to each other are simultaneously detectable. This position sensitive type detector 51 is combined with the single-pass cylindrical mirror analyzer 50 according to the invention. This is because the energy resolution of the single-pass cylindrical mirror analyzer 50 is changed due to a change of the transmitting energy when the energy scanning is performed therein. Accordingly, the energy resolution of this detector 51 is varied in synchronism with the energy scanning of the single-pass cylindrical mirror analyzer 50, the energy analysis can be finally achieved with maintaining constant energy resolution, i.e., allowable energy resolution. Although such a single-pass cylindrical mirror analyzer 50 is employed in the electron analyzer according to the invention, the requirements for performing the photoelectron analysis can be sufficiently satisfied.

Accordingly, the particular advantages, according to the invention, exist in that an increase of the sensitivity achieved by employing the single-pass cylindrical mirror analyzer equipped with the movable target and the position sensitive type detector can compensate for a reduction of the sensitivity on the order of 1/100 due to narrowing the X-ray beam, and thus a very small region of the sample, having a diameter of approximately 0.1 mm, can be photoelectron-analyzed with maintaining the high sensitivity and high energy resolution.

As a result, when the deflection voltage for the electron beam is kept fixed and the sweep signal of the spectro-scanning power supply 52 is synchronized with the photoelectron signal derived from the position sensitive type detector 51, the analyzed photoelectron spectrum in the specific narrow region having a diameter of, e.g., 0.1 mm can be displayed on the recorder 60.

Thereafter, when the spectro-scanning operation is stopped, the electron beam scanning is effected by the scanning signal which is supplied to the deflection plate 40 and derived from the beam deflection/scanning power supply 42, and the photoelectron detection signal derived from the position sensitive type detector 51 is utilized as the luminance modulation signal, a specific photoelectron image 71 in the very small region of the sample 4, having a square of approximately 1 mm, can be displayed on the TV monitor 70 with the spatial resolution of 10×10 division. In accordance with the above-described analyzing method, various images corresonding to the element conditions of the sample surface can be obtained, so that the lateral distribution of these element conditions can be very precisely displayed. Since the electron beam is continuously deflected and scanned according to the invention, the same energy dispersion effect can be achieved as in the case that the target 2 is frequently moved. Accordingly, even if the conventional target is employed, a higher intensity of the X-rays can be obtained according to this method.

In the previous embodiment, the X-ray excitation electron gun 1 is provided in the differential pumping chamber 80 having an aperture 81 through which the electron beams 8 can be derived. As the electron beams 8 are narrowed, or focused, the diameter of this aperture 81 is very small. The differential pumping chamber 80 is differential-pumped out by a high-vacuum pump (not shown) different from another high-vacuum pump (not shown in detail) for the exhaust of the target portion. As is known in the art, large quantities of gas discharge occur from the electron gun 1 due to its extremely high temperature. In accordance with the pumping arrangement of the invention, since the size (or diameter) of this aperture 81 through which the electron beam 8 can pass, is very small, most of the discharged gas does not flow through this aperture 81 toward the target 2, but is exhausted by the above high vacuum pump in the direction indicated by an arrow 83. Consequently, the target 2 can be located in the high-vacuum circumstance, so that there is no problem of contamination.

As previously described in detail, the photoelectron analysis for the very small region having a diameter less than 1 mm can be practically realized, thereby permitting sectioning of the samples.

BASIC IDEA OF THIRD CATEGORY

A description will now be made of a basic idea of the third category according to the invention.

The analysis of the sample surface according to the third category will be implemented as follows. First, the analysis of the sample surface is performed by employing an electron beam as an irradiating beam supply means in such a way that the electron beam emitted from the electron beam source positioned outside an outer cylindrical electrode is irradiated to the surface of the sample to be inspected via beam passing holes made on the outer and inner cylindrical electrodes. When the electron beam is irradiated to the sample surface, Auger electrons are emitted therefrom, so that the element analysis of the sample surface can be implemented by an electronic detector. Similarly, when an irradiating beam emitted from other beam supply means is utilized to analyze the sample surface, the predetermined beam is emitted from outside of a cylindrical mirror type energy analyzer, and then irradiated to the sample through beam passing apertures formed on the inner and outer cylindrical electrodes. In response to this sample irradiation, emission beams are produced from the sample surface and then conducted to either emission beam detecting means or an electronic detector through the beam passing apertures, so that the desirable element analysis can be accomplished.

Broadly stated, at least one of various irradiation beams as well as emission beams (except for Auger electrons and photoelectrons to be energy-analyzed) are irradiated to the sample surface via the beam passing holes formed on both the inner and outer cylindrical electrodes according to the sample analysis of the invention, so that it is possible to deeply set angles of the irradiation beams as well as of the emission beams with respect to the sample surface. Since the electron beam source is provided outside the outer cylidnrical electrode, there is no disturbance within the inner cylindrical electrode and near the sample, which is caused by leakage of the electric field and magnetic field from the electron beam source.

ARRANGEMENT OF FOURTH EMBODIMENT BELONGING TO THIRD CATEGORY

A very important feature of the cylindrical mirror type energy analyzer 200 according to the fourth embodiment is that an electron beam source 206 as irradiation beam supply means is arranged outside an analyzer frame 202, and electron passing holes 212 to 214 are formed on predetermined portions of the cylindrical mirror type energy analyzer 200, through which electron beams 206A emitted from the electron beam source 206 are passed to a sample 207.

Figure 6B:
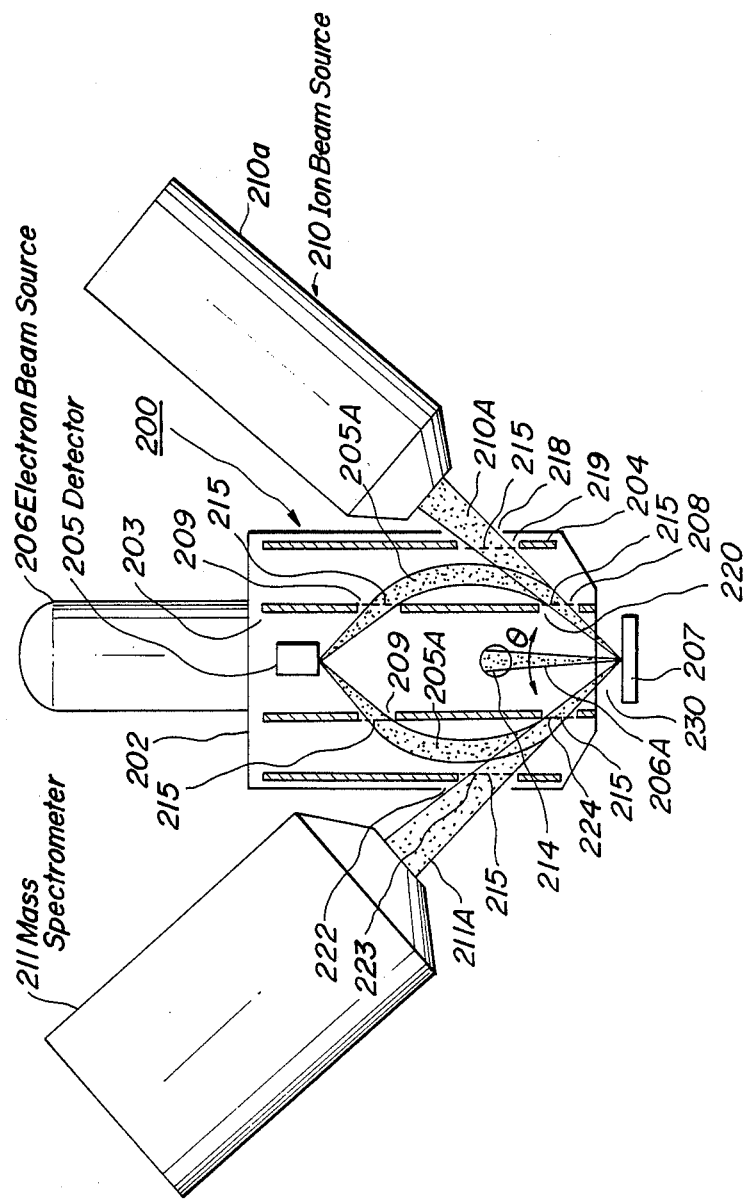

Referring now to FIGS. 6A and 6B, the cylindrical mirror type energy analyzer 200 will be described according to the third category of the invention. A first electron beam passing hole 212 is formed on the analyzer frame 202, a second electron beam passing hole 213 is made on an outer cylindrical electrode 204, and furthermore a third electron beam passing hole 214 is formed on an inner cylindrical electrode 203. Through all of these beam passing holes 212 to 214, electron beams 206A having higher energy of for instance, 5 to 50 keV emitted from the electron beam source 206 can be irradiated to the sample 207 (see FIGS. 6A and 6B).

Assuming that an opening angle of the beam at the beam irradiating position of the sample 207 is determined by "$\theta$", viewing angles of the first, second and third electron beam passing holes 212 to 214 with respect to this beam irradiating position are selected to be more than "$\theta$", and accordingly, the electron beam 206 can be correctly irradiated to a given position of the sample 207 (see FIG. 6A). The optimum positions for the first, second and third electron beam passing through holes 212 to 214 are determined by various conditions of the cylindrical mirror type energy analyzer 200. Typically, these positions are determined by the practical method. Namely, a straight line connecting centers of the first to third electron beam passing holes 212 to 214 is inclined to 40 to 45 degrees with respect to a center axis of the cylindrical mirror type energy analyzer 200. If the disturbance of the electric field produced between the inner cylindrical electrode 203 and the outer cylindrical electrode 204 needs to be particularly prevented, metal meshes 215 are provided on the beam passing holes 213 to 214.

As seen from FIG. 6B, the third electron beam passing hole 214 is independently formed with respect to a lower slit 208 made on the inner cylindrical electrode 203. However, it is possible for this power slit 208 to have common functions as the beam passing hole.

In the fourth embodiment characterized by the above-described first feature, the electron beam 206A is emitted from the electron beam source 206 and then irradiated to the sample 207 through the first to third electron beam passing holes 212 to 214. The low energy charged particles are emitted from the sample 207. Among these charged particles, the low energy charged particles such as Auger electrons (normally 0.1 to 1 keV) are incident from the lower slit 208 of the inner cylindrical electrode 203 to a space between the inner electrode 203 and the outer electrode 204. Then, the orbit of this incident elecron is controlled by a potential difference between the inner cylindrical electrode 203 and the outer cylindrical electrode 204. Detectable electrons 205A are travelled along a substantially parabolic orbit and energy-analyzed. Thereafter, the energy-analyzed electrons 205A are again incident from an upper slit 209 in the inside of the inner cylindrical electrode 203, and finally received by an electron detector 205. The electron detector 205 detects detectable electrons 205A.

A second feature of the fourth embodiment is that firstly other irradiating beam supply means and emission beam detection means arranged outside the analyzer frame 202, and secondly, beam passing holes through which the beams irradiated from the beam supply means to the sample 27 as well as the emission beams detected by the beam detection means can pass, respectively, are formed on the inner cylindrical electrode 203, the outer cylindrical electrode 204, and the analyzer frame 202, respectively.

According to this embodiment, the above irradiating beam supply means are constituted by an ion beam source 210 for emitting ion beams 210A having high energy (normally, 5 to 50 keV) an X-ray beam source 216 for emitting X-ray beams 216A as neutron (photon), and a visible light beam source 217 for emitting visible light beams 217A as neutron (photon). On the analyzer frame 202, first irradiation beam passing holes 218 are formed for passing these beams emitted from the ion beam source 110, the X-ray beam source 116, and the visible light source 117. That is, the first irradiation beam passing holes 218 are formed on the peripheral wall of the analyzer frame 202, the positions of which correspond to the above-described sources 110, 116, 117, respectively. Second irradiation beam passing holes 219 are formed on the outer cylindrical electrode 204 as in the same manner as the first irradiation beam passing holes 218. Further, third irradiation beam passing holes 220 are formed on the inner cylindrical electrode 203, so that the respective irradiation beams emitted from the corresponding beam sources 210, 216, and 217 can be supplied to the sample 207 through the first to third irradiation beam passing holes 218 to 220. The emission beam detection means is constructed by a mass spectrometer 211 and a microscope 221.

As is known, the main spectrometer 211 analyzes secondary ion (neutral molecule) 211A having higher energy emitted from the sample 207, while the microscope 221 receives beams 221A reflected from the sample 207, which are neutral molecule, so as to observe micro-scopically the sample surface.

ADVANTAGES OF FOURTH EMBODIMENT

As previously explained, the first irradiation beam passing holes 222 are formed on the analyzer frame 202, the second irradiation beam passing holes 223 are made on the outer cylindrical electrode 204 and further the third irradiation beam passing holes 224 are constructed on the inner cylindrical electrode 203. As a result, the above-described secondary ion 211A emitted from the sample 207 and the reflection beam 221 reflected from the sample 207 are conducted to the corresponding mass spectrometer 211 and microscope 221. According to the fourth embodiment as shown in FIGS. 6A and 6B, the mass spectroscopic inspection is carried out for the secondary ion 211A in the mass spectrometer 211, the outer appearance of the sample surface 207 is microscopically effected by the microscope 221, and moreover, the photoelectrons 225A emitted from the sample 207 to which the X-ray beams 216A are irradiated are conducted to the electron detector 205 via the substantially same orbit as that of the Auger electron, thereby being detected by the electron detector 205.

Detectable electrons 205A are constituted by these Auger electrons and photoelectrons 225A. Accordingly, the Auger electron analysis, and the mass spectroscopic analysis for the secondary ion 211A, as well as the analysis and the outer appearance observation for the photoelectrons 225A can be performed according to the fourth embodiment, so that the analysis for the sample 207 can be correctly implemented.

Since the electron beam source 206, X-ray beam source 216 and visible light beam source 217 are arranged outside the analyzer frame 202, no adverse influence is given to the inside of the inner cylindrical electrode 203 and adjacent regions to the sample 207 even if the electric field and magnetic field leak from those beam sources. The precision of the sample analysis can be correctly implemented.

As previously described in detail, the electron beams 206A, ion beams 210A and X-ray beams 216A and further visible light beams 217A can be passed to the sample 207 through the first to third electron beam passing holes 212 to 214, or generally the first to third irradiation beam passing holes 218 to 220. Similarly, the various beams emitted from the sample 207 (except for the Auger electrons and photoelectrons to be energy-analyzed) can be conducted to the corresponding detection means through the first to third emission beam passing holes 222 to 224. Accordingly, the irradiation angles (or the incident angles) of the beams which are irradiated to the sample can be selected to be greater, and the emission angles (or, the reflection angles) of the beams which are emitted from the sample 207 can be selected to be also greater by designing the hole positions for the irradiation beams and the emission beams. Even if the sample surface has a concave-and-convex form, the sample analysis can be effectively accomplished according to the invention.

ARRANGEMENT OF FIFTH EMBODIMENT BELONGING TO THIRD CATEGORY

Referring to FIG. 7, a description will now be made of a cylindrical mirror type energy analyzer 300 according to a fifth embodiment belonging to the third category of the invention.

It should be noted that the same reference numerals shown in FIGS. 6A and 6B are employed for the same, or similar components shown in FIG. 7.

Different arrangements of the analyzer 300 from those of the analyzer 200 shown in FIGS. 6A and 6B are that an objective lens 226 comprised of the irradiating beam supply means and an objective lens 227 comprised of the emission beam detection means are provided inside the inner cylindrical electrode 203.

According to this fifth embodiment, the irradiating beam supply means is constructed of the ion beam source 210, whereas the emission beam detection means is constructed of the mass spectrometer 211. The ion beam source 210 typically includes an ion producing section, an ion drawing section, an ion beam converging lens section, and an objective lens for finally focusing the ion beams onto the sample 207. These components (not shown in detail) are mounted on the frame 202.

It should be noted that this objective lens may be separately provided in the ion beam source 210.

According to the fifth embodiment, the objective lens 226 is separated from the frame 202 and positioned inside the inner cylindrical electrode 203 along the orbit of the ion beams 210A.

Similarly, the objective lens 227 of the mass spectrometer 211 is positioned along the orbit of the secondary ion beams 211A within the internal space of the inner cylindrical electrode 203.

The advantages of arranging these objective lenses 226 and 227 within the inner cylindrical electrode 203 are as follows. As to objective lens 226, a distance between the objective lens 226 and the sample 207, i.e., an operation distance can be shortened, whereby a diameter of the ion beam (210A) spot irradiated to the sample 207 can be narrowed. Secondly, even if the travelling of the ion beams 210A is more or less disturbed under the influence of the electric field when the ion beams 210A pass through the electric field generated between the inner cylindrical electrode 203 and the outer cylindrical electrode 204, substantially no adverse effect by the disturbing electric field can be given to the ion beams 210A by focusing them by the objective lens 226.

Concerning the remaining objective lens 227, the secondary ion 211A with the higher density can be fed to the mass spectrometer 211 by effectively collecting the secondary ion emitted from the sample 207. Accordingly, the precise element analysis of the sample 207 can be accomplished by the correlative advantages of arranging the objective lenses 226 and 227.

It is apparent that such an arrangement of these objective lenses 226 and 227 may be employed as objective lenses of other irradiating beam supply means as well as other emission beam detection means, resulting in the same advantages. Furthermore, it is possible to provide, for instance, a deflection plate, an astigmatism plate and an aperture at the sides of the objective lenses 226 and 227.

ARRANGEMENT OF SIXTH EMBODIMENT BELONGING TO THIRD CATETORY

A description will now be made of an electron analyzer 400 according to a sixth embodiment belonging to the third category of the invention with reference to FIGS. 8A and 8B.

As apparent from FIGS. 8A and 8B, a different construction from the previous fourth and fifth embodiments is that the X-ray beam source 216 (see FIG. 6A) is constructed of a reflection crystal plate 228 as the irradiating beam supply means. That is to say, this X-ray beam source of this embodiment is constructed of an X-ray generating section 229 and the reflection crystal plate 228. The X-ray generating section 229 is provided on the central axis of the cylindrical mirror type energy analyzer 400, from which the X-rays are omnidirectionally emitted. This reflection crystal plate 228 is of a two-dimensional focusing type bending crystal plate by which the X-ray separation analysis is performed due to the Bragg reflection, but also the X-rays are two-dimensionally focused. A plurality of such crystal plates 228 are continuously or interruptedly arranged around the central axis of the cylindrical mirror type energy analyzer 400 with the axial-symmetrical relation thereto. Most of the X-rays emitted from the X-ray generating section 229 are separated and converged toward the sample 207, with the result that the X-ray beams 216A having a toroidal shape or a partial toroidal shape are irradiated to the sample 207.

The irradiation angle of the X-ray beam 216A with respect to the sample 207 (namely, an angle defined by the central axis of the cylindrical mirror type energy analyzer 400 and the X-ray beams 216A) is selected to be 40 to 45 degrees. The X-ray beams 216A are irradiated at this angle to the sample 207 through the second irradiating beam passing holes 219 found on the outer cylindrical electrode 204 and the third irradiating beam passing holes 220 formed on the inner cylindrical electrode 203.

Then, the photoelectrons 225A, or detectable electrons 205A emitted from the sample 207 during the X-ray irradiation are entered into a space defined between the inner cylindrical electrode 203 and the outer cylindrical electrode 204, and thereafter are orbit-controlled in a similar control fashion as in the fourth embodiment, and finally received by the electron detector 205.

Similarly, as the beam irradiation angle and also the beam emission angle with respect to the sample 207 can be selected to be greater, the precise element analysis can be achieved even for the sample having a concave and convex surface.

It should be understood that the reflection crystal plate 228 need not be designed by the above two-dimensional focusing type bending crystal plate, but alternatively may be formed as a one-dimensional focusing type one a non-focusing type crystal plate.

In the fourth to sixth preferred embodiments, the outer cylindrical electrode 204 was formed by the cylindrical plates, on which the third irradiating beam passing hole 220 and the third emission beam holes 224 have been formed. It is also possible to form the entire outer cylindrical electrode 204 by the metal mesh.

As previously described in detail, even if the sample surface has a concave-and-convex surface, e.g., an IC (integrated circuit) having a three-dimensional structure and a piece of iron having a sharp break plane be analyzed with extremely high precision.

What is claimed is:

1. A photoelectron spectrometer, comprising:
   a target;
   an electron gun for irradiating electron beams to the target so as to cause X-ray beams to be emitted from the target;
   a crystal plate for focusing the X-ray beams emitted from the target and for reflecting the focused X-ray beams to a sample for irradiating therefrom photoelectrons;
   a single-pass cylindrical mirror type electron analyzer for spectrum-analyzing the photoelectrons emitted from the sample, said analyzer including an inner cylindrical electrode and an outer cylindrical electrode surrounding said inner cylindrical electrode, beam passing holes formed on said inner cylindrical electrode and said outer cylindrical electrode;
   a detector for detecting the spectrum-analyzed photoelectrons;
   wherein said electron gun is arranged substantially coaxially with respect to a reference axis connecting said target and said sample;
   wherein said crystal plate is arranged in a circular region with respect to said reference axis; and
   wherein said analyzer including said inner and outer cylindrical electrodes are positioned concentrically about said reference axis such that at least one of said X-ray beams and at least some of the photoelectrons would pass through said beam passing holes of said inner and outer cylindrical electrodes.

2. A photoelectron spectrometer as claimed in claim 1, wherein said electron gun and said target are positioned within said inner cylindrical electrode of said cylindrical mirror type electron analyzer.

3. A photoelectron spectrometer as claimed in claim 1, wherein said target is movable in a two-dimensional direction perpendicular to a passing direction of said electron beams.

4. A photoelectron spectrometer as claimed in claim 1, wherein said electron gun comprises an ultra-small focusing type electron gun which deflects the electron beams; and wherein an electron irradiated position of said target is movable along a surface of said target.

5. A photoelectron spectrometer as claimed in claim 1, wherein said single-pass cylindrical mirror type analyzer comprises a position sensitive type detector; and wherein the energy resolution of said position sensitive type detector is varied in response to the energy scanning of said analyzer.

6. A photoelectron spectrometer as claimed in claim 1, further comprising:
   a differential pumping chamber surrounding said electron gun; and
   means for differential-pumping said differential pumping chamber and for feeding the electron beams out from an aperture formed on said differential pumping chamber.

* * * * *

UNITED STATES PATENT AND TRADEMARK OFFICE
CERTIFICATE OF CORRECTION

PATENT NO. : 4,752,685
DATED : June 21, 1988
INVENTOR(S) : Yoshiro Shiokawa, et al.

It is certified that error appears in the above-identified patent and that said Letters Patent is hereby corrected as shown below:

Column 1, line 28, delete "in a";

line 34, delete "and";

line 48, change "anaylzer" to --analyzer--;

line 54, delete "in a".

Column 2, line 10, change "Althrough" to --Although--.

Column 3, line 18, change "cylidrical" to --cylindrical--;

Column 5, line 28, change "trasmission" to --transmission--.

Column 6, line 30, change "are" to --is--.

Column 7, bridging lines 43 and 44, change "mechanically" to --mechanical--;

line 44, change "curves" to --curved--.

Column 8, line 4, change "beams" to --beam--;

line 5, change "beam" to --beams--;

line 10, change "though" to --through--;

line 27, change "delfection" to --deflection--;

line 55, change "plate crystal" to --crystal plate--

UNITED STATES PATENT AND TRADEMARK OFFICE
CERTIFICATE OF CORRECTION

PATENT NO. : 4,752,685

DATED : June 21, 1988

INVENTOR(S) : Yoshiro Shiokawa, et al.

It is certified that error appears in the above-identified patent and that said Letters Patent is hereby corrected as shown below:

Column 9, line 21, change "changed," to --changed.--.

Column 10, line 11, before "X-rays" insert --The--;

line 32, delete "and".

Column 12, line 2, change "5" to --50--.

Column 13, line 64, change "cylidnrical" to --cylindrical--.

Column 14, line 30, change "206" to --206A--;

line 62, change "elecron" to --electron--.

Column 15, line 9, change "27" to --207,--.

Column 16, line 57, change "converging" to --converting--.

Column 17, line 33, change "CATETORY" to --CATEGORY--.

Column 18, line 4, delete "225A";

line 21, change "one" to --on--;

line 31, after "plane" insert --can--.

UNITED STATES PATENT AND TRADEMARK OFFICE
CERTIFICATE OF CORRECTION

PATENT NO.   : 4,752,685

DATED        : June 21, 1988

INVENTOR(S)  : Yoshiro Shiokawa, et al.

It is certified that error appears in the above-identified patent and that said Letters Patent is hereby corrected as shown below:

In the Abstract, line 6, delete "on the" and "line".

Signed and Sealed this

Tenth Day of January, 1989

*Attest:*

DONALD J. QUIGG

*Attesting Officer*    *Commissioner of Patents and Trademarks*